(12) United States Patent
Kumar et al.

(10) Patent No.: US 8,183,939 B1
(45) Date of Patent: May 22, 2012

(54) RING OSCILLATOR

(75) Inventors: Ajay Kumar, Dallas, TX (US);
Krishnaswamy Nagaraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/078,712

(22) Filed: Apr. 1, 2011

(51) Int. Cl.
*H03K 3/03* (2006.01)
(52) U.S. Cl. .............. 331/57; 331/182; 331/185
(58) Field of Classification Search .......... 331/57, 331/182, 183, 185, 186
See application file for complete search history.

(56) References Cited

U.S. PATENT DOCUMENTS 4,328,571 A 5/1982 Noble
4,560,954 A * 12/1985 Leach .............. 331/108 B \* cited by examiner

*Primary Examiner* — James E Goodley
(74) *Attorney, Agent, or Firm* — Ronald O. Neerings; Wade James Brady, III; Frederick J. Telecky, Jr.

(57) ABSTRACT

A ring oscillator has at least one latch connected to the outputs of at least one oscillator stage, where the latch drives the outputs of the oscillator stage to opposite states during startup, and drive strength reduction circuitry to reduce drive strength of the latch after startup when the oscillator is oscillating.

18 Claims, 7 Drawing Sheets

RING OSCILLATOR

DESCRIPTION OF THE RELATED ART

A ring oscillator is essentially a chain of delay elements forming a loop, with at least one active element such that the output of the chain is the inverse of the input of the chain. For example, in FIG. 1, a ring oscillator 100 is formed from a chain of three inverters (102, 104, 106). If inverter 102 changes states, then after a short delay, inverter 104 changes states, and after another short delay, inverter 106 changes states, and the output of inverter 106 causes inverter 102 to change states, and so forth. A ring oscillator formed from single-output inverters needs an odd number of stages so that the output of the last inverter (inverter 106 in the example of FIG. 1) is the logical inverse of the input of the chain.

A differential ring oscillator is formed from a chain of differential amplifiers, differential inverter circuits, or inverter pairs, and may have an even number of stages. For example, in FIG. 2A, a two-stage differential ring oscillator 200 is formed from a first stage 202 and a second stage 204, where each stage is an inverter pair (206, 208) (210, 212). When oscillator 200 is oscillating, the inverters are in a meta-stable state. That is, the inverters achieve saturated states only momentarily, and most of the time they are transitioning between saturated states. More specifically, when oscillator 200 is oscillating, each inverter delays a waveform as in FIG. 2B by one-fourth of the period of the waveform. The voltage numbers in FIG. 2A show the voltage at one particular instant of time at the input and output of each inverter. In particular, note that at the captured instant in time, two inverter outputs are at a voltage that is halfway between a binary "one" and a binary "zero".

The differential ring oscillator illustrated in FIG. 2A can start up in a stable state, which prevents oscillation. In FIG. 2C, the binary numbers at the inputs and outputs of the inverters illustrate a set of logical states in which circuit 200 is stable. If that logical state occurs at startup, the circuit will not start oscillating.

DETAILED DESCRIPTION

Figure 2C:
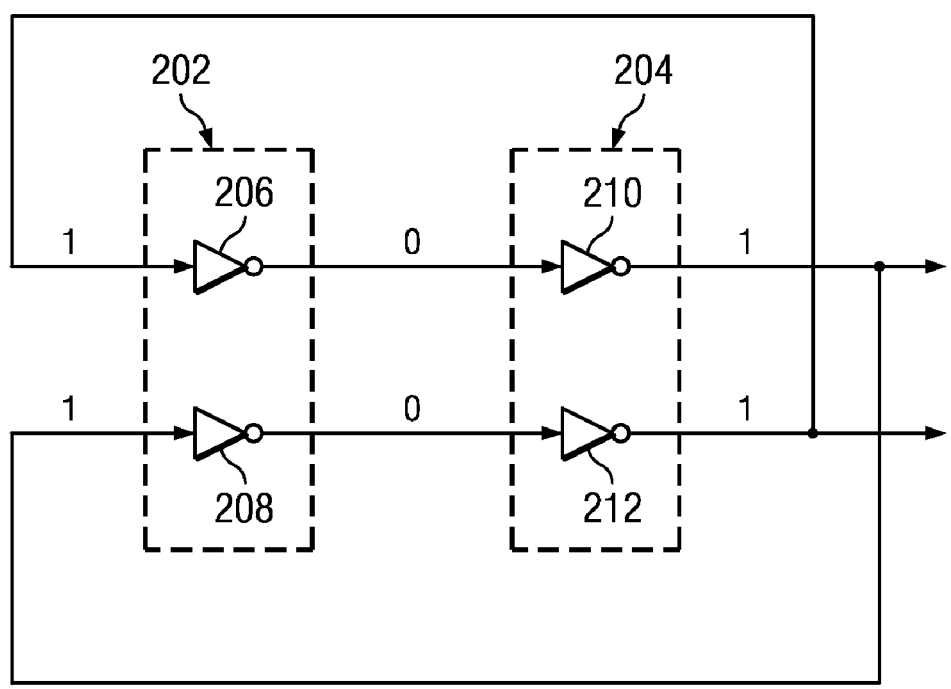
FIG. 2C is a block diagram illustrating the oscillator of FIG. 2A in a stable state.
Figure 3A:
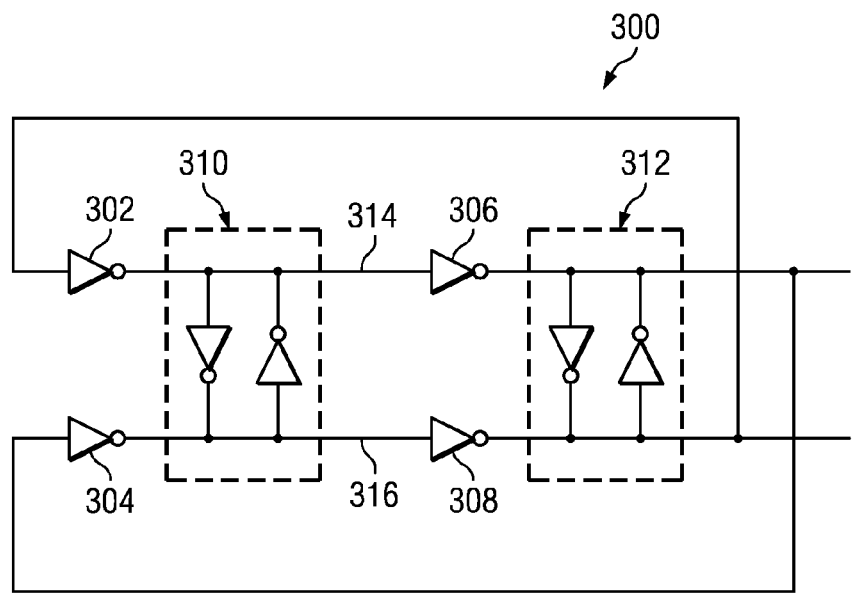
FIG. 3A is a block diagram of an example embodiment of a differential ring oscillator with circuitry to ensure start up.

FIG. 3A illustrates an example two-stage differential ring oscillator 300 with additional circuitry to ensure oscillation at start up. A pair of front-to-back inverters forms a latch (310, 312) at the differential outputs of each stage of the oscillator. In a static state, a latch (for example, latch 310) drives each of the output nodes (for example, 314, 316) of a stage to opposite logical states. If, for example, oscillator 300 starts up in a state with nodes 314 and 316 at the same logical state (as in FIG. 2C), then latch 310 will force the nodes 314 and 316 to opposite logical states. In order for latch 310 to overdrive inverters 302 and 304 from a saturated state, the transistors in latch 310 driving nodes 314 and 316 must be able to drive more current than the transistors in inverters 302 and 304 driving nodes 314 and 316. The capability of a circuit to provide current to a node or to sink current from a node is called drive strength. In general, a larger transistor can drive more current than a smaller transistor. If, for example, the transistors driving the outputs in the latch 310 are larger than the transistors driving the outputs in inverters 302 and 304, then the transistors driving the outputs of latch 310 can overdrive the outputs of the first stage inverters 302 and 304 and force the oscillator 300 out of a startup stable state. During oscillation, in meta-stable mode, latches 310 and 312 further prevent inverters 302, 304, 306, and 308 from going into a non-oscillatory stable state. However, latches 310 and 312 consume power during oscillation, and generate phase noise.

Figure 1:
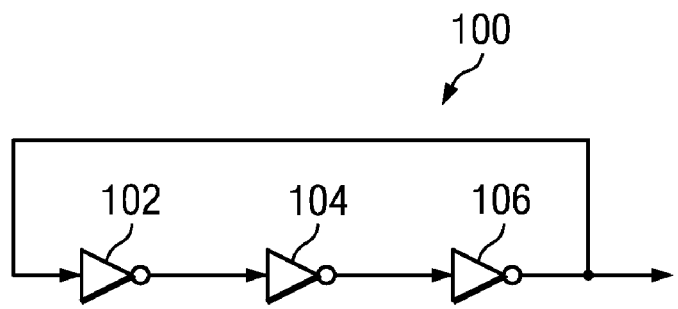
FIG. 1 is a block diagram illustrating an example prior art ring oscillator.
Figure 2A:
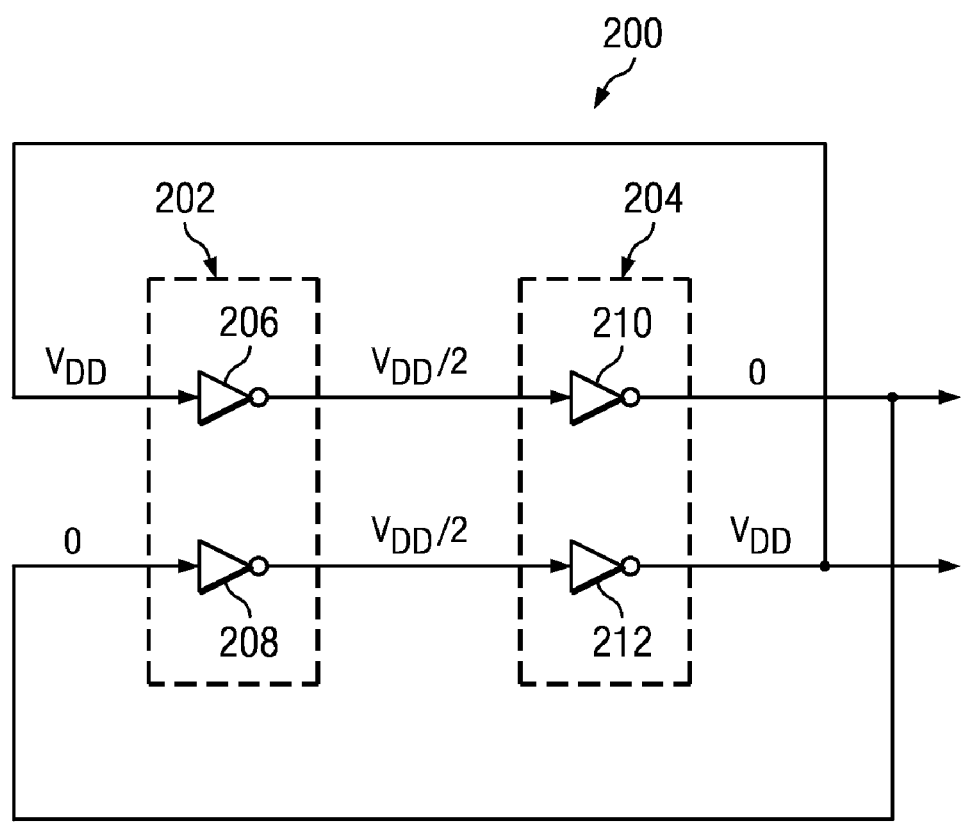
FIG. 2A is a block diagram illustrating an example prior art differential ring oscillator.
Figure 2B:
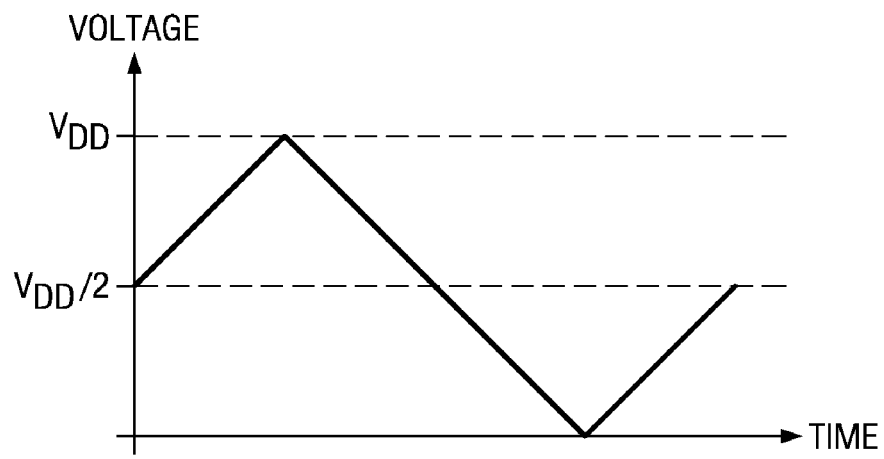
FIG. 2B is a graph illustrating voltage as a function of time for points within the oscillator of FIG. 2A.

In general, there is a need to reduce power and reduce phase noise. The drive strength required for latches 310 and 312 to sustain oscillation after startup is much less than the drive strength required to ensure startup. During startup, the inverters 302, 304, 306, and 308 may be in a stable non-oscillatory state where their outputs are saturated (logical "one" or "zero"), as illustrated in FIG. 2C. Therefore, during startup, latches 310 and 312 must have larger drive strength than the inverters 302, 304, 306, and 308. However, once oscillation has started, the input or output of each inverter is usually at a voltage that is somewhere between a binary "one" and a binary "zero" (as illustrated in FIGS. 2A and 2B), which puts the inverters in a meta-stable state. When the inverters are in a meta-stable state, the latches only need to guide the outputs, as opposed to completely overdriving the outputs. This guiding can be achieved with latches that have smaller drive strength than the inverters 302, 304, 306, and 308. Thus, if the drive strength of the latches can be dynamically reduced after startup, power consumption and phase noise of the ring oscillator can be reduced significantly.

Figure 3B:
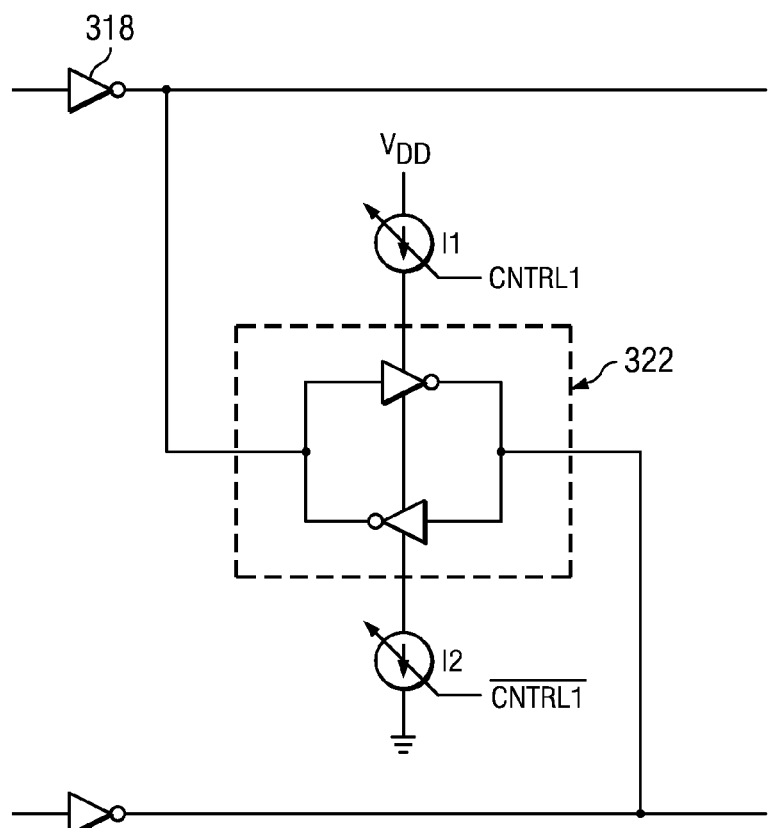
FIG. 3B is a block diagram illustrating additional detail for an example embodiment of part of the oscillator of FIG. 3A.
Figure 3C:
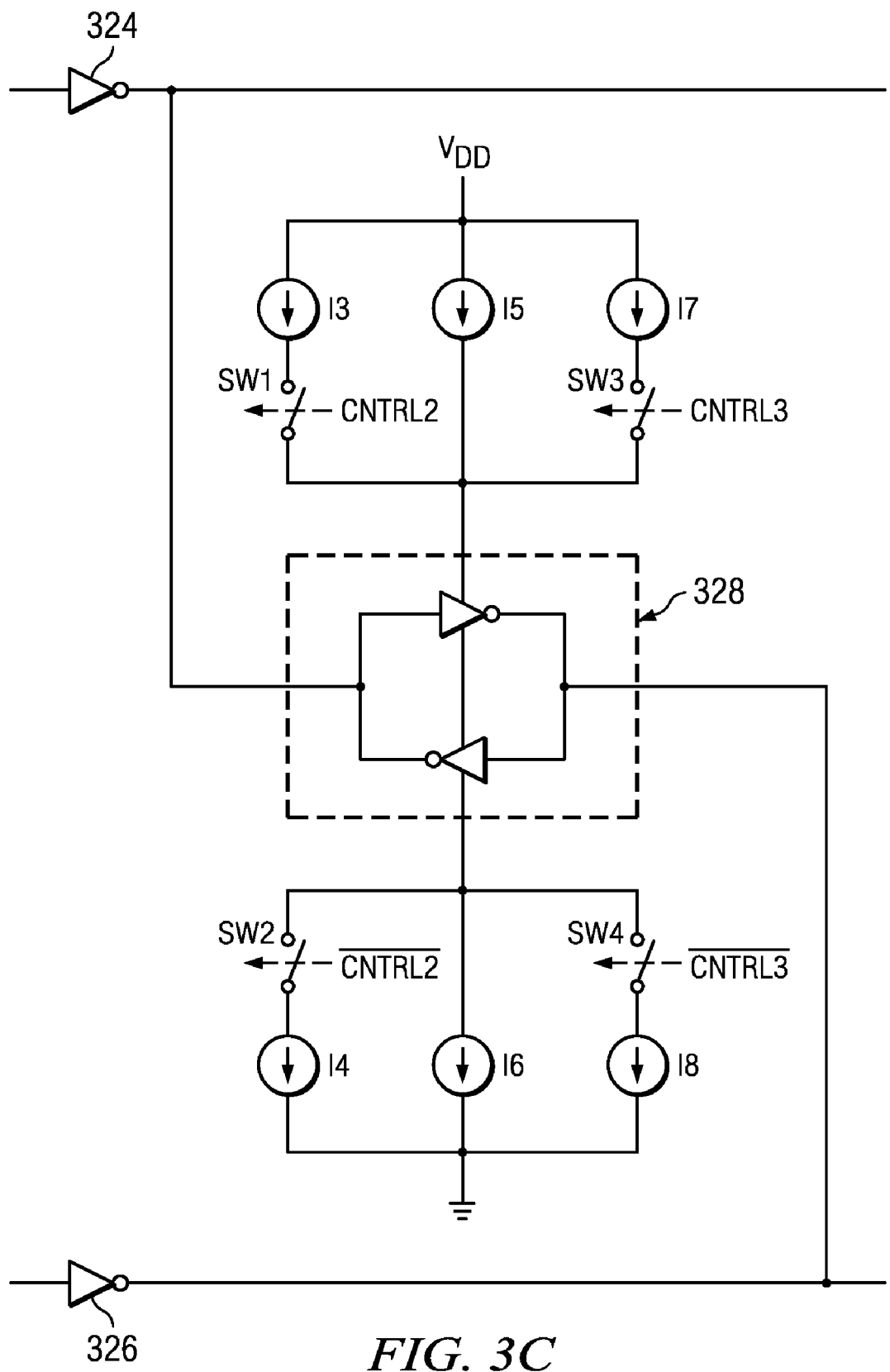
FIG. 3C is a block diagram illustrating additional detail for an alternative example embodiment of part of the oscillator of FIG. 3A.
Figure 3D:
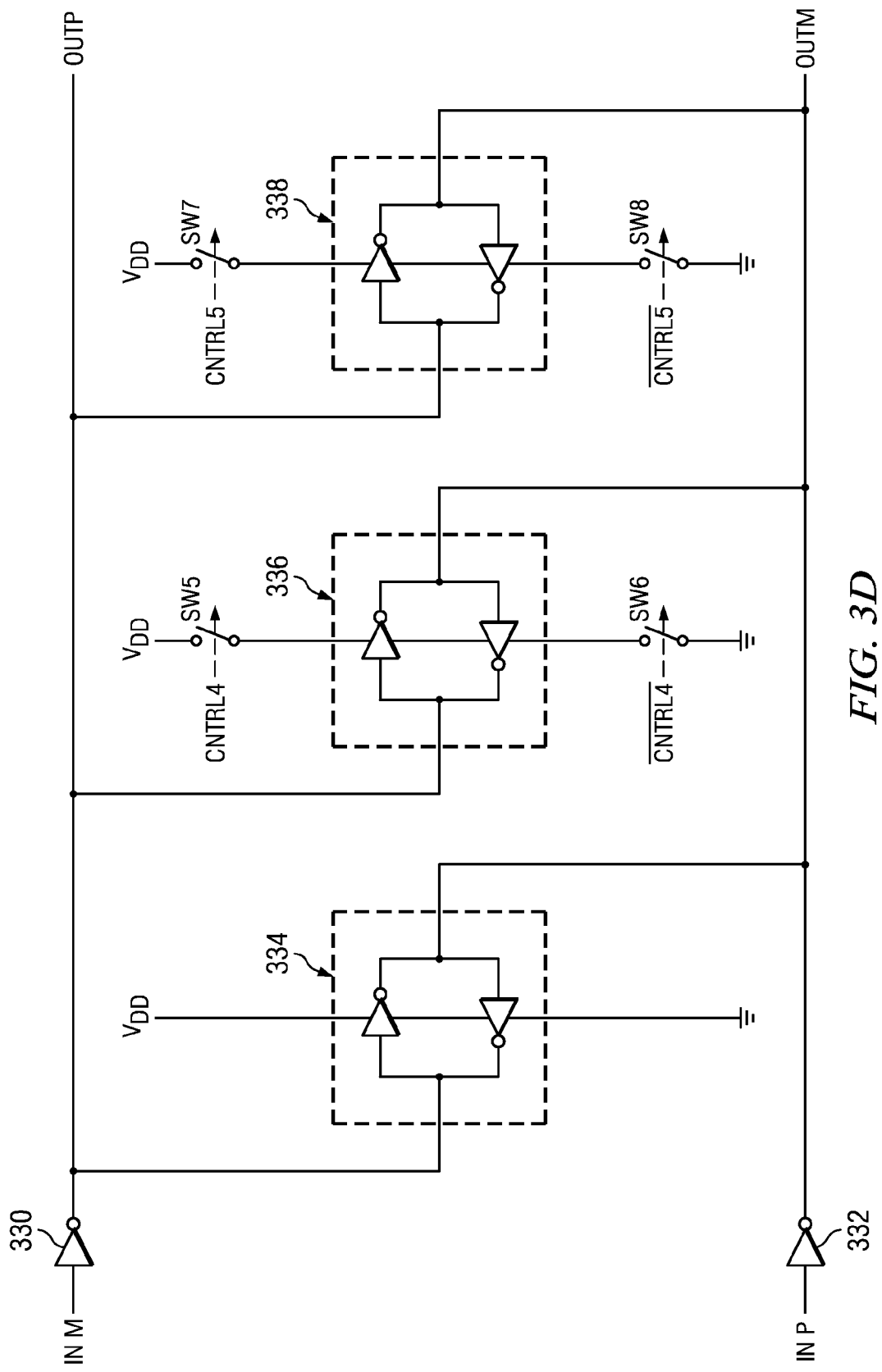
FIG. 3D is a block diagram illustrating additional detail for an alternative example embodiment of part of the oscillator of FIG. 3A.

FIGS. 3B, 3C, and 3D illustrate three example embodiments of latches having controllable drive strength, so that drive strength can be reduced after startup. Typically, latch drive strength may be reduced by about 50% after startup to reduce power but still assist in oscillation. Latch power may be more than 50% of the overall oscillator power, so a reduction in latch power consumption of about 50% may result in about a 25% reduction in overall oscillator power consumption.

Often, multiple clock phases are needed, and a differential ring oscillator may be used to generate multiple clock phases. For example, in FIG. 2A, the phase of the differential outputs of stage 202 are offset ninety degrees relative to the phase of the differential outputs of stage 204. Therefore, in many systems, it is important for the oscillator output waveforms to be as symmetrical as possible. That is, the magnitude of the slope of the voltage waveform in FIG. 2B needs to be constant. This requirement for symmetry requires the magnitude of the total drive strength (inverters and latches) at each output node to be as identical as possible for all output nodes. Accordingly, in FIG. 3A, if symmetrical multi-phase oscillator outputs are required, then if a latch 312 is present at the outputs of inverters 306 and 308, then a latch 310 needs to be present at the outputs of inverters 302 and 304, and the total drive strength at each oscillator output node needs to be as identical as possible to the total drive strength at each other output node.

In the following examples, latch drive strength can be reduced after oscillation begins. However, if latch drive strength is changed too rapidly, then a transient condition may cause oscillation to stop. Accordingly, latch drive strength needs to be changed slowly, or in relatively small discrete steps. In addition, as discussed above, all latches need to change drive strength as identically as possible to ensure waveform symmetry.

FIG. 3B illustrates a first example embodiment of a latch with drive strength that can be reduced after the oscillation starts. In FIG. 3B, inverters 318 and 320 may correspond to inverters 302 and 304 in FIG. 3A, or to inverters 306 and 308 in FIG. 3A. Likewise, latch 322 in FIG. 3B may correspond to latch 310 in FIG. 3A, or to latch 312 in FIG. 3A. In FIG. 3B, a controllable variable current source I1 is in series with the path to the power supply $V_{DD}$ for each of the inverters in the latch 322, and a controllable variable current source I2 is in series with the path to the ground supply for each of the inverters in the latch. Current source I1 is controlled by a control signal CNTRL1 and current source I2 is controlled by the complement (inverse) of control signal CNTRL1. I1 and I2 may be gradually decreased after oscillation begins, or they may be decreased in a plurality of discrete steps. Current sources I1 and I2 may be realized, for example, by current mirrors, and the control signal (for example, CNTRL1) may control the number of fingers of the current mirror device or its gate voltage. Note that I1 and I2 also affect the drive strength of the latch outputs, so the current values for I1 and I2 may be chosen equal to provide a symmetrical clock waveform, but this not necessary.

FIG. 3C illustrates a second example embodiment of a latch with drive strength that can be reduced after the oscillation starts. In FIG. 3C, inverters 324 and 326 may correspond to inverters 302 and 304 in FIG. 3A, or to inverters 306 and 308 in FIG. 3A. Likewise, latch 328 in FIG. 3C may correspond to latch 310 in FIG. 3A, or to latch 312 in FIG. 3A. In FIG. 3C, the drive strength of the latch 324 can be reduced in two discrete steps. In FIG. 3C, latch 328 has three parallel current sources (I3, I5, I7) in the path to $V_{DD}$, and three parallel current sources (I4, I6, I8) in the path to ground. At startup, switches SW1, SW2, SW3, and SW4 are all closed, so that latch 328 has as large a drive strength as possible. Then, sometime after oscillation begins, control signal CNTRL2 (and its logical complement) cause switches SW1 and SW2 to open, disconnecting current sources I3 and I4 from the latch 328. Then, after allowing adequate time for transients to settle, control signal CNTRL3 (and it logical complement) cause switches SW3 and SW4 to open, disconnecting current sources I7 and I8 from latch 328. Together, I3, I4, I5, I6, I7, and I8 define the total drive strength of the latch 328, I3 and I4 may be sized, for example, to reduce the latch drive strength by 25% of the startup drive strength, and I7 and I8 may be sized, for example, to reduce the latch drive strength by an additional 25% of the startup drive strength. Current sources I5 and I6 remain connected at all times so that latch 328 helps sustain oscillation. Each pair of current sources (I3 and I4, I5 and I6, I7 and I8) may be chosen to have equal current values to ensure waveform symmetry. However, it is not necessary for I3 and I5 and I7 to have equal current values, or for I3 and I4 to have same current value, or for I5 and I6 to have the same current value, or for I7 and I8 to have the same current value. Switches SW1, SW2, SW3, and SW4, may be, for example, FETs.

The example embodiments of FIGS. 3B and 3C may be combined. That is, one or more of the current sources in FIG. 3C may be variable.

FIG. 3D illustrates a third example embodiment of a latch with a drive strength that can be reduced after the oscillation starts. In FIG. 3D, inverters 330 and 332 may correspond to inverters 302 and 304 in FIG. 3A, or to inverters 306 and 308 in FIG. 3A. Likewise, the combination of latches 334, 336, and 338 in FIG. 3D may correspond to latch 310 in FIG. 3A, or to latch 312 in FIG. 3A. In the example of FIG. 3D, there are three latches (334, 336, and 338) in parallel, two of which (336 and 338) have switches in their power supply and ground paths. At startup, switches SW5, SW6, SW7, and SW8 are all closed so that all three latches contribute to startup drive strength. Sometime after oscillation begins, control signal CNTRL4 (and its logical complement) causes switches SW5 and SW6 to open, effectively removing latch 336 from the oscillator circuit. Then, after adequate time for transients to settle, control signal CNTRL5 (and its logical complement) causes switches SW7 and SW8 to open, effectively removing latch 338 from the oscillator circuit. Latch 334 remains connected at all times to help sustain oscillation. Latches 336 and 338 may be, for example, about one-half the size of latch 334. Removing latch 336 then reduces overall latch drive strength by about 25%, and removing latch 338 reduces overall latch drive strength by about an additional 25%. However, it is not necessary for latches 336 and 338 to be the same size.

Figure 4:
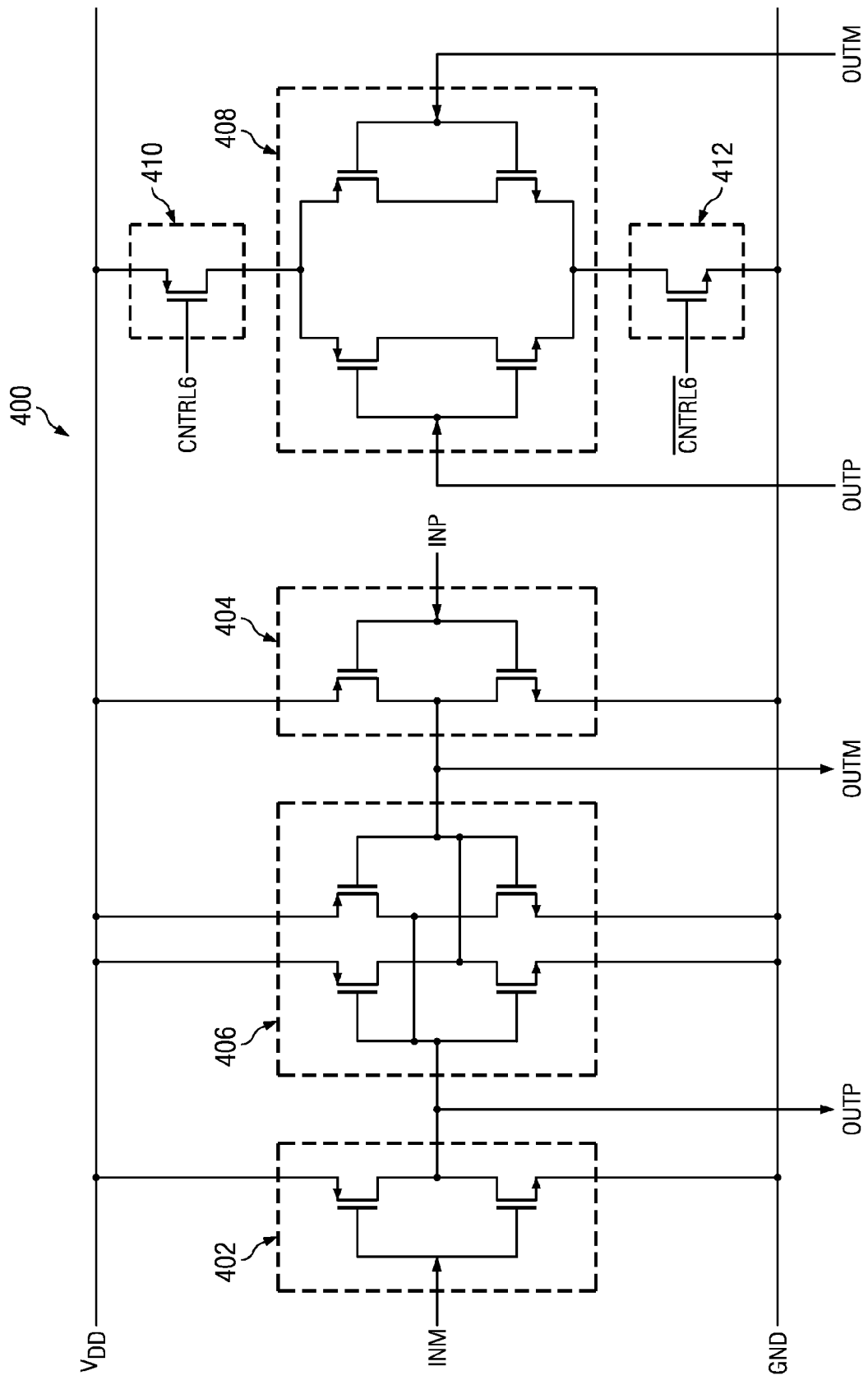
FIG. 4 is a circuit diagram illustrating additional detail for an example embodiment for part of the oscillator of FIG. 3D.

FIG. 4 illustrates an example of additional detail for part of the circuit of FIG. 3D. In FIG. 4, inverters 402 and 404 correspond to inverters 330 and 332 in FIG. 3D. INP is a positive input signal, INM is a negative (minus) input signal, OUTP is a positive output signal, and OUTM is a negative (minus) output signal, each corresponding to an identically named signal in FIG. 3D. Latch 406 in FIG. 4 corresponds to latch 334 in FIG. 3D. Latch 408 in FIG. 4 corresponds to latch 336 in FIG. 3D (or to latch 338 in FIG. 3D). Transistors 410 and 412 in FIG. 4 correspond to switches SW5 and SW6 (or to switches SW7 and SW8), respectively, in FIG. 3D. Control signal CNTRL6 in FIG. 4 corresponds to control signal CNTRL4 (or to control signal CNTRL5) in FIG. 3D. The transistors in latch 406 may be, for example, about 60% of the size of the transistors in inverters 402 and 404, and transistors in latch 408 may be, for example, about 50% of the size of the transistors in latch 406. At startup, total latch drive strength for three parallel latches will then be about 120% of the drive strength provided by inverters 402 and 404, and latch drive strength may be reduced in steps of about 25%.

Figure 5:
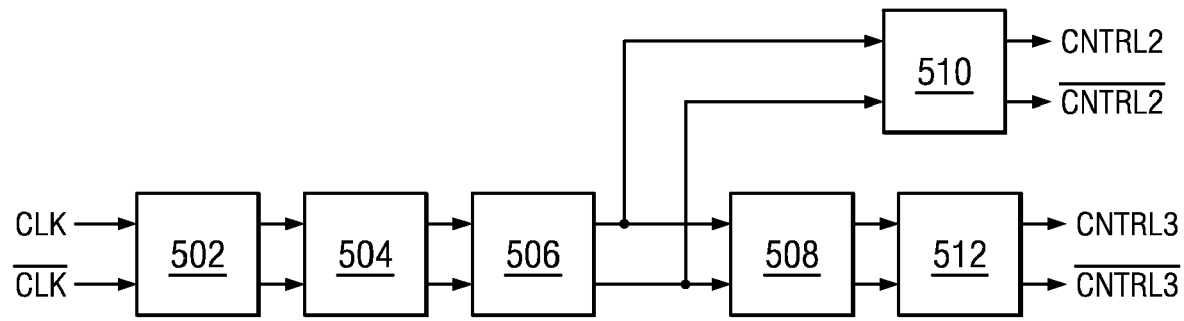
FIG. 5 is a block diagram of an example embodiment of a control circuit for generating various control signals illustrated in FIG. 3C.

FIG. 5 illustrates one possible example implementation of a circuit for generating control signals CNTRL2 and CNTRL3 in FIG. 3C (or CNTRL4 and CNTRL5 in FIG. 3D) (or CNTRL 6 in FIG. 4). In FIG. 5, a four-bit counter (flip-flops 502, 504, 506, 508) receives the differential outputs (CLK) of an oscillator. When the counter reaches a count of four, a latch 510 generates signal CNTRL2. When the counter reaches a count of eight, a latch 512 generates signal CNTRL3. A count of four or eight is just an example. The robustness can be improved by increasing the count, for example, waiting until the count reaches 16 before generating CNTRL 2 and waiting until the count reaches 32 before generating CNTRL3. This would reduce the possibility of a false start operation due to any glitches or transients in the oscillator at startup.

Figure 6:
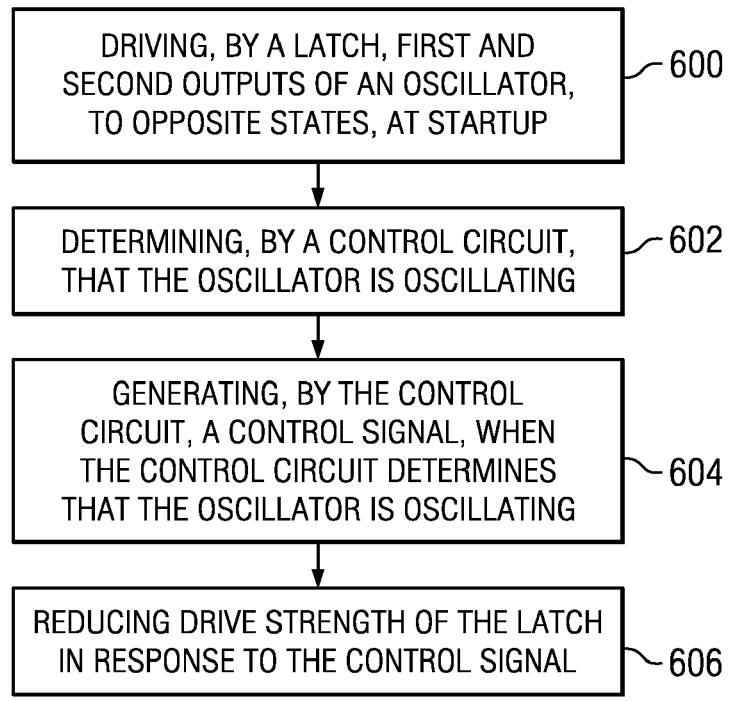
FIG. 6 is a flow chart of an example embodiment of a method of controlling a ring oscillator.

FIG. 6 illustrates an example method for controlling a differential ring oscillator. Note that the arrangement of steps in the figure does not necessarily imply any particular chronological order, and some steps may occur simultaneously. At step 600, a latch drives first and second outputs of the oscillator to opposite states during startup. At step 602, a control circuit determines that the oscillator is oscillating. At step 604, the control circuit generates a control signal when the control circuit determines that the oscillator is oscillating. At step 606, drive strength of the latch is reduced in response to the control signal.

What is claimed is:

1. A ring oscillator, comprising:
   at least one oscillator stage having first and second outputs;
   at least one latch comprising:
      a first inverter having an inverter input connected to the first output of the oscillator stage and an inverter output connected to the second output of the oscillator stage;
      a second inverter having an inverter input connected to the second output of the oscillator stage and an inverter output connected to the first output of the oscillator stage; and
   drive strength reduction circuitry configured to reduce drive strength of the latch when the ring oscillator is oscillating.

2. The ring oscillator of claim 1, the drive strength reduction circuitry comprising: a variable current source in a power supply path to the latch.

3. The ring oscillator of claim 2, further comprising:
   control circuitry configured to detect when the oscillator is oscillating, the control circuitry configured to generate a control signal when the oscillator is oscillating.

4. The ring oscillator of claim 3, the control circuitry configured to cause the variable current source to continuously change current for a period of time.

5. The ring oscillator of claim 3, the control circuitry configured to cause the variable current source to change current in a plurality of discrete steps.

6. The ring oscillator of claim 1, the drive strength reduction circuitry comprising: a plurality of current sources in parallel in a power supply path to the latch, at least one of the current sources having a controllable switch in series with the current source.

7. The ring oscillator of claim 6, further comprising:
   control circuitry configured to detect when the oscillator is oscillating, the control circuitry configured to generate a control signal when the oscillator is oscillating.

8. The ring oscillator of claim 7, the control circuitry configured to control the controllable switch to open when the oscillator is oscillating.

9. The ring oscillator of claim 1, the latch further comprising:
   at least two latches in parallel;
   the drive strength reduction circuitry comprising:
      a controllable switch in a power supply path for at least one of the parallel latches.

10. The ring oscillator of claim 9, further comprising:
    control circuitry configured to detect when the oscillator is oscillating, the control circuitry configured to generate a control signal when the oscillator is oscillating.

11. The ring oscillator of claim 10, the control circuitry configured to control the controllable switch to open when the oscillator is oscillating.

12. The ring oscillator of claim 1, further comprising: an even number of oscillator stages.

13. The ring oscillator of claim 12, further comprising: at least one latch driving the outputs of each oscillator stage.

14. The ring oscillator of claim 13, the drive strength of each latch being reduced at the same time and by the same amount.

15. A method for controlling a ring oscillator, comprising:
    driving, by a latch, first and second outputs of the ring oscillator to opposite states at startup;
    determining, by a control circuit that the oscillator is oscillating;
    generating, by the control circuit, a control signal when the control circuit determines that the oscillator is oscillating; and,
    reducing drive strength of the latch in response to the control signal.

16. The method of claim 15, the step of reducing drive strength further comprising:
    decreasing current in a current source in a power supply path to the latch.

17. The method of claim 15, the step of reducing drive strength further comprising:
    opening a switch in series with a current source in a power supply path to the latch.

18. The method of claim 15, the step of reducing drive strength further comprising:
    opening a switch in a power supply path to the latch.

* * * * *